US008159819B2

(12) United States Patent
Memon

(10) Patent No.: US 8,159,819 B2
(45) Date of Patent: Apr. 17, 2012

(54) MODULAR THERMAL MANAGEMENT SYSTEM FOR GRAPHICS PROCESSING UNITS

(75) Inventor: Anwar Noor Memon, Orange, CA (US)

(73) Assignee: XFX Creation Inc., Hong Kong (CN)

( * ) Notice: Subject to any disclaimer, the term of this patent is extended or adjusted under 35 U.S.C. 154(b) by 31 days.

(21) Appl. No.: 12/780,682

(22) Filed: May 14, 2010

(65) Prior Publication Data
US 2011/0279969 A1 Nov. 17, 2011

(51) Int. Cl.
*G06F 1/20* (2006.01)
*H05K 7/20* (2006.01)

(52) U.S. Cl. ......... 361/679.47; 361/679.48; 361/679.52; 361/679.54; 361/695; 361/697; 361/700; 361/704; 361/709; 361/719; 165/80.2; 165/80.3; 165/185

(58) Field of Classification Search .......... 361/679.46–679.48, 679.52, 679.54, 361/690, 694–695, 697, 700, 703–704, 709–710, 361/719; 165/80.2–80.3, 185; 174/15.2, 174/16.1, 16.3
See application file for complete search history.

(56) References Cited

U.S. PATENT DOCUMENTS

| 7,126,826 | B1 | 10/2006 | Sorensen et al. |
| 7,151,667 | B2 | 12/2006 | Walters et al. |
| 7,365,989 | B2 * | 4/2008 | Peng et al. ..................... 361/720 |
| 7,382,621 | B2 * | 6/2008 | Peng et al. ..................... 361/719 |
| 7,443,672 | B2 * | 10/2008 | Peng et al. ..................... 361/695 |
| 7,443,680 | B1 * | 10/2008 | Peng et al. ..................... 361/704 |
| 7,495,923 | B2 * | 2/2009 | Peng et al. ..................... 361/719 |
| 7,529,090 | B2 * | 5/2009 | Peng et al. ..................... 361/700 |
| 7,755,902 | B2 * | 7/2010 | Peng et al. ..................... 361/719 |
| 7,782,617 | B2 * | 8/2010 | Li et al. ......................... 361/700 |
| 7,885,073 | B2 * | 2/2011 | Peng et al. ..................... 361/700 |
| 7,990,719 | B2 * | 8/2011 | Chen et al. .................... 361/719 |
| 2008/0158820 | A1 * | 7/2008 | Peng et al. ..................... 361/703 |
| 2009/0059525 | A1 * | 3/2009 | Peng et al. ..................... 361/697 |

* cited by examiner

*Primary Examiner* — Robert J Hoffberg
(74) *Attorney, Agent, or Firm* — Seed IP Law Group PLLC

(57) ABSTRACT

A modular thermal management system that allows one or a few heat sink and fan combinations to transfer heat away from a heat zone of a variety of graphics processing cards is provided. The thermal management system includes a mounting bracket configured to attach to the graphics processing card in thermal contact with the heat zone, the mounting bracket having a first opening that corresponds to a processor in the heat zone, a heat sink configured to attach to the mounting bracket, wherein the heat sink overlies the first opening and is in thermal contact with at least a portion of the processor through the first opening, and a fan configured to attach to the mounting bracket adjacent the heat sink.

11 Claims, 5 Drawing Sheets

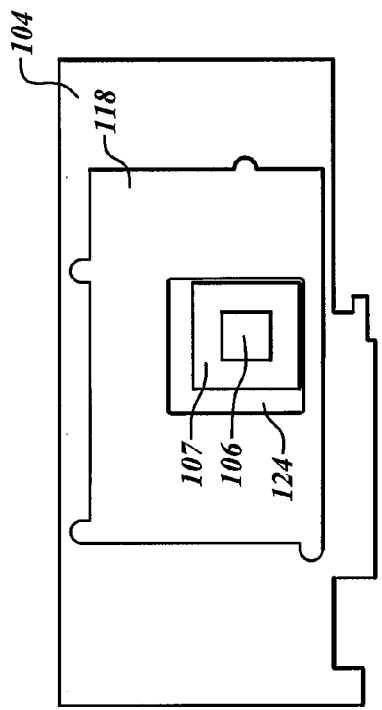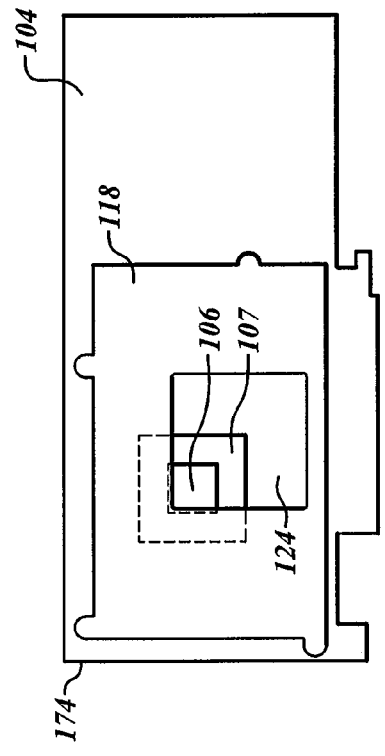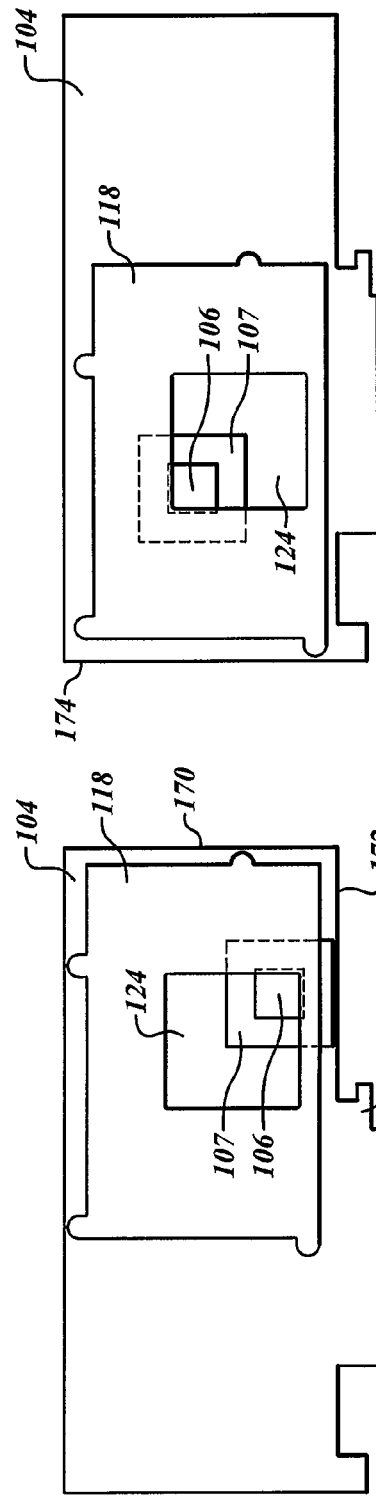

MODULAR THERMAL MANAGEMENT SYSTEM FOR GRAPHICS PROCESSING UNITS

BACKGROUND

1 Technical Field

The present disclosure relates to a modular thermal management system for one or more graphics processing cards, and more particularly, to a mounting bracket configured to thermally couple to different graphics processing cards and to cooperate with a heat sink and a fan to transfer heat away from a heat zone of the graphics processing cards.

2. Description of the Related Art

To generate graphical images for display on electronic devices, such as computers or televisions, binary data from a central processing unit is often translated by a graphics processing unit (GPU). The GPU determines how to manipulate pixels to form an image described by the binary data. Some GPUs are integrated in a motherboard that share memory with the central processing unit. Other GPUs are integrated in dedicated graphics processing cards, which are configured to interface with the central processing unit on the motherboard.

The GPUs are designed to quickly execute instructions to calculate and display the graphics for the devices, including displaying textures, rendering geometric images, and rotating and translating vertices into different coordinate systems. The GPUs also provide pixel shading that renders objects to appear, e.g., shiny, dull, rough, or round. Creating the images is a demanding process that uses significant amounts of power and generates significant amounts of heat. The heat emitted results from repeating the GPU processes at rates of sixty times per second, i.e., continuously refreshing the image on the display. Without the GPU, the central processing units could not adequately handle displaying the images.

Powerful graphics processing is achieved in after-market or dedicated graphics processing cards that are printed circuit boards having a GPU, memory, an interface to receive power and data, a communication port to interface with the screen, and other circuitry such as resistors and capacitors. The GPU generates information regarding what to do with each pixel associated with a display device. The memory stores the information about each pixel and stores temporary information about completed images to be displayed. The interface for power and data often couples to the motherboard through an expansion slot or an accelerated graphics port. These graphics processing cards are easily replaced or upgraded by the user.

The graphics processing cards typically consume more energy and demand more electrical power than central processing units. Accordingly, the graphics processing cards generate significant amounts of heat that can damage the components near the GPU or other devices in a host system, such as a computer or a game console.

Manufacturers of graphics processing cards design heat dissipation systems for each individual GPU for each card model. The heat dissipation systems often include a fan and heat sink that are vertically stacked and positioned directly on top of the GPU.

Every time a new graphics processing card is designed, a new heat dissipation system is designed. Since each heat dissipation system is associated with a single GPU and graphics processing card configuration, manufacturers must maintain a complex inventory of heat sink, fan, and other heat dissipation parts. This leads to higher costs of production as well as an increase in time-to-market for new designs.

Many graphics processing card failures relate to failures in the heat dissipation system, which requires replacement of the entire heat dissipation system. In order to continue assembly of a specific card configuration and to maintain warranties, the manufacturers must stock and maintain an inventory of the specific components for each heat dissipation system. This process is costly and complicated for the manufacturer to maintain, especially through the life of the warranties of all of the different types of graphics processing cards they sell.

BRIEF SUMMARY

A modular thermal management system that allows one or a few heat sink and fan combinations to transfer heat away from a heat zone of a variety of different graphics processing cards is provided. Components of the modular thermal management system can be applied in several configurations for use with multiple graphics processing card layouts. In addition, the modular components are easily individually serviceable.

The thermal management system includes a mounting bracket that is configured to attach to each of the differently configured graphics processing cards. The mounting bracket has an opening that overlies the heat zone of the graphics processing card, which includes at least the graphics processing unit (GPU) or chip. The bracket is configured to be in thermal contact with the GPU and other heat generating components on the graphics processing card.

An arrangement of the components on each graphics processing card can vary depending on different design specifications, such as different memory requirements for different GPUs. Since the GPU is memory intensive, the memory is positioned within close proximity to the GPU in order to minimize the distance electrical signals must travel. The heat zone corresponds to an area of each graphics processing card where the GPU and the memory are positioned.

The thermal management system includes a heat sink that is configured to couple to the mounting bracket to be in thermal contact with the heat zone through the opening in the mounting bracket. The heat sink overlies at least a portion of the GPU that is positioned within the opening. The thermal management system also includes a fan that is configured to couple to the mounting bracket adjacent the heat sink. The fan incorporates an active heat transfer with the passive heat transfer of the heat sink.

Several heat sink and fan configurations can be configured to couple to the mounting bracket to provide the manufacturer with design variations. The mounting bracket of the thermal management system is transferable to a variety of graphics processing cards having heat zones in a plurality of locations. The modular thermal management system reduces inventory costs and reduces inventory complexity across various card designs. In addition, the thermal management system simplifies the warranty process.

BRIEF DESCRIPTION OF THE SEVERAL VIEWS OF THE DRAWINGS

FIGS. 4A-4C are top plan views of alternative embodiments of the graphics processing card of FIGS. 3A-3D in relation to an adjustable bracket position according to another embodiment of the present disclosure.

DETAILED DESCRIPTION

Figure 1:
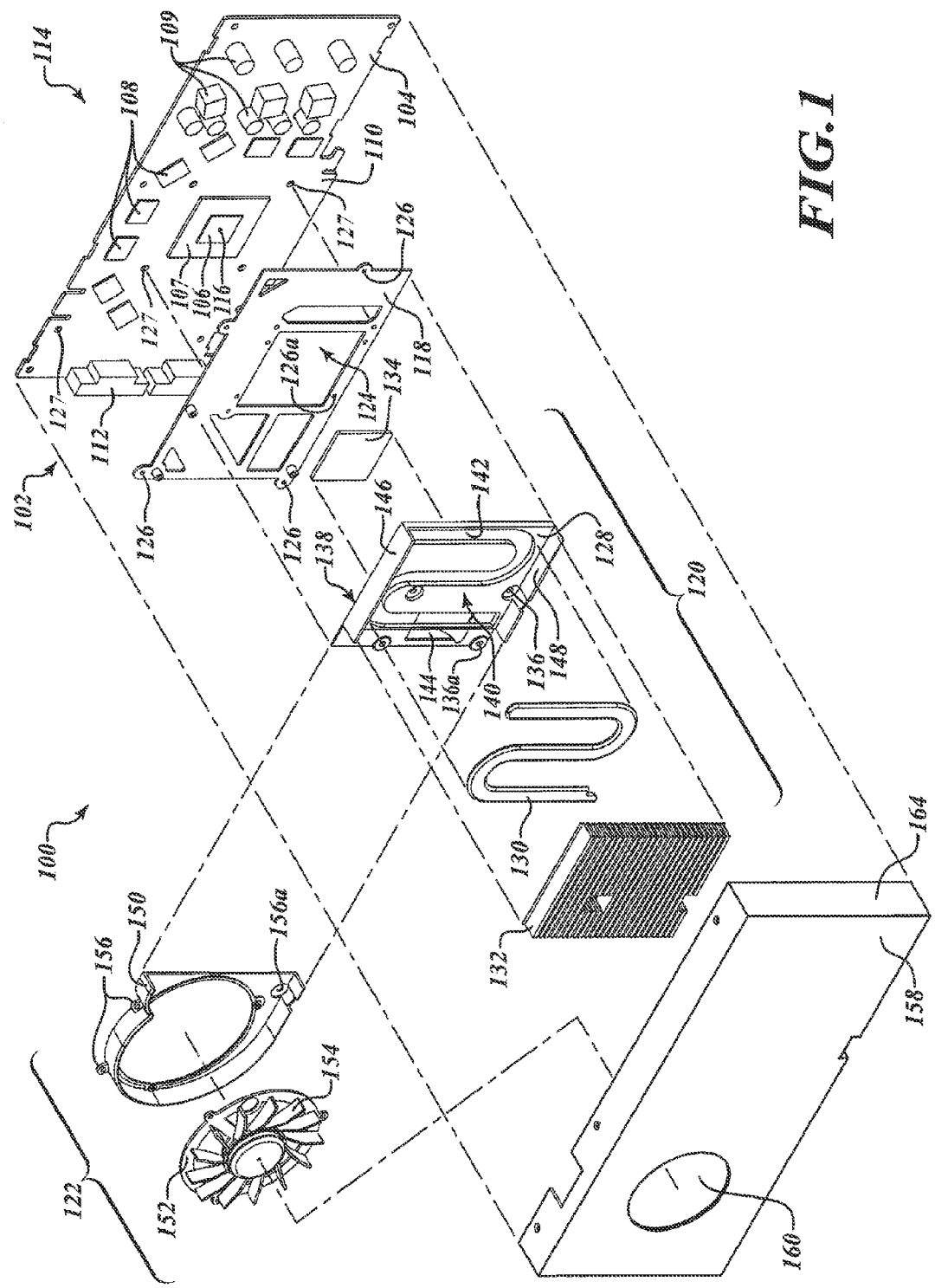
FIG. 1 is an exploded view of a modular thermal management system according to an embodiment of the present disclosure.

FIG. 1 is an exploded view of a modular thermal management system 100 configured to dissipate heat from a plurality of different graphics processing cards 102 according to one embodiment of the present disclosure. The modular thermal management system 100 includes a mounting bracket 118, a heat sink 120, and a fan 122. The graphics processing cards 102 can be between 9-inch and 10.5-inch printed circuit boards 104 that include a graphics processing unit (GPU) 106 electrically connected to a plurality of memory modules 108.

Each graphics processing card 102 includes additional components 109 that cooperate with the GPU 106 and the memory 108 to perform complex mathematical computations to display images on a display, such as a television or computer monitor. The GPU 106 is a specialized processor that determines how to treat each pixel on the display. Information about each pixel is stored in the memory 108 before it is transmitted to the display. In some circumstances, the memory 108 will store the information about each pixel until the image is complete and then transmit the image to the display.

A configuration of the components 109, the GPU 106, and the memory 108 on the graphics processing card 102 varies based on specifications of the GPU 106, which can be provided by original equipment manufacturers. For example, each GPU 106 uses different amounts of memory and different configurations of the components 109, which may include resistors, capacitors, diodes, and other electronic devices to make the graphics processing card 102 operational. These recommended configurations from the original equipment manufacturers can be varied to achieve the designs of the printed circuit boards 104 created by the manufacturer of the graphics processing cards 102. The manufacturer of the graphics processing cards designs the layout of the printed circuit board based on the chosen cooling solution.

The modular thermal management system 100 is configured to interact and dissipate heat from a heat zone 114 of each graphics processing card 102. The heat zone 114 is associated with an area, within which the GPU 106 and the memory 108 are positioned. Since the GPU 106 is a memory intensive processor, the memory 108 is often positioned close to the GPU 106 on the graphics processing cards 102. The manufacturer of the graphics processing cards 102 can select a configuration of the GPU 106, the memory 108, and the other components 109 to form the heat zone 114 for each card design. The thermal management system 100, which is configured to dissipate heat from the heat zone 114, can be utilized across a variety of graphics processing card designs.

The mounting bracket 118 includes a first opening 124 configured to be positioned overlying at least a portion of the heat zone 114 of the different graphics processing cards 102. The heat sink 120 and the fan 122 are configured to attach to the mounting bracket 118 where each is at least partially overlapping the first opening 124. Since the mounting bracket 118 can attach to differently configured graphics processing cards 102, the heat sink 120 and the fan 122 combination can also be attached to the different graphics processing cards 102.

The modular thermal management system 100 produces economies of scale for the manufacturer of the graphics processing cards. For example, instead of having a different heat sink and fan combination for each type of graphics processing card, the manufacturer can maintain a smaller inventory of the mounting bracket 118, the heat sink 120, and the fan 122. In one embodiment, the manufacturer may have heat sinks 120 of various shapes and styles that are interchangeable and configured to attach to the mounting bracket 118. In addition, the manufacturer may have several fans 122 that are all interchangeable and configured to interact with the various heat sinks 120 and the mounting bracket 118.

The manufacturer can incorporate a new GPU 106 or design a new layout or configuration of the components 109 for a new model of the graphics processing card 102 without having to design a new heat dissipation system. The existing inventory of the thermal management system 100 can be used with the new card layout by merely positioning the GPU 106 and the memory 108 in a configuration that causes the heat zone 114 to be located at least partially within the opening 124 in the mounting bracket 118. Advantageously, the new graphics processing card 102 may be available more quickly in the marketplace without having to design a new cooling system.

The modular thermal management system 100 is also beneficial to the manufacturer's warranty department because the modular components are readily available. This can reduce costs associated with maintaining inventory of all previously sold graphics processing cards. In addition, failures often occur in one of the cooling components, such as the fan or the heat sink. The modular thermal management system 100 allows the manufacturer to easily replace the damaged component from the standard inventory instead of replacing the entire system. This decreases repair time and reduces the waste produced by throwing away working components. This also saves the manufacturer money by only replacing the failed component.

As mentioned above, each type of GPU 106 is manufactured separately from the printed circuit board 104. The original equipment manufacturer processes a semiconductor wafer to form individual GPU die that are packaged and shipped to the manufacturers of the graphics processing cards 102. The GPU 106 typically includes an amount of packaging 107 that extends beyond an exterior boundary of the GPU 106.

The graphics processing card 102 includes the printed circuit board 104 having the GPU 106 and a first interface 110 for communication with a host system and a second interface 112 for communication with a display. The first interface 110 connects the processing power of the graphics processing card 102 with the host system, such as a computer or gaming console. For example, the first interface 110 may be a peripheral component interface (PCI), a PCI Express, or an accelerated graphics port that couples the graphics processing card to a motherboard of the computer. The motherboard can supply power and data to the graphics processing card 102. In some embodiments, the graphics processing card 102 is directly connected to the computer's power supply or a dedicated power supply in order to meet higher power needs of the GPU 106.

The second interface 112 connects the graphics processing card 102 to the display or displays, which may be achieved with a digital video interface, a VGA monitor connector, or other television or graphic display connector. Often the graphics processing card 102 includes a plurality of second interfaces 112 to provide the user with display options. For example, the graphics processing card 102 communicates with LCD screens through the DVI connector and to a CRT screen through the VGA connector. Additional interfaces may be included to provide for dual monitor capability that splits the display between two displays.

A center 116 of the heat zone 114 corresponds to a center of the GPU 106. The heat results from increased processing power and speed as compared to the other components on the printed circuit board 104. As described above, the exact position of the GPU 106 and the memory 108 can vary from card to card because the thermal management system 100 is designed to transfer heat away from the heat zone 114 rather than from a specific GPU.

The mounting bracket 118 is configured to be positioned overlying the graphics processing card 102 so that at least a portion of the GPU 106 is within the first opening 124. Various configurations of the mounting bracket 118 positioned with respect to the GPU 106 are illustrated in FIGS. 3A-3D and 4A-4C as described below.

In one embodiment, the mounting bracket 118 is a thermally conductive material that is rectangular and smaller in size than the printed circuit board 104. The mounting bracket 118 has a plurality of holes 126 that relate to a plurality of holes 127 on the printed circuit board 104 and are configured to receive a fastener, such as a screw, a clamp, or a rivet. The mounting bracket 118 may be manufactured to have more holes 126 to accommodate for the different models of the graphics processing cards 102. For example, the mounting bracket 118 may have holes 126 to accommodate a 9-inch card with a first GPU and a 10.5-inch card having a second GPU in a different location. The size of the mounting bracket 118 need not change, just the positioning of the mounting bracket 118 on the different cards.

The mounting bracket 118 may be formed from a metal, such as aluminum that is easily stamped from sheets to form the holes 126 and the first opening 124. Other conductive materials, such as brass, copper, gold, tungsten, graphite, and silicon may be used to form the mounting bracket 118 to transfer heat away from the printed circuit board 104 to the heat sink 120 and fan 122.

The heat sink 120 is configured to transfer thermal energy or heat away from the GPU 106 and the heat zone 114 of the printed circuit board 104. Often heat sinks are designed to rapidly transfer heat away from a heat source, e.g., GPU 106, to bring the GPU into thermal equilibrium with the heat sink 120. In one embodiment, the heat sink 120 includes a rectangular base 128, a heat pipe 130, a plurality of fins 132, and a heat spreader 134.

The base 128 may be metal or other conductive material that thermally conducts heat away from the GPU 106. The base 128 couples to the mounting bracket 118 through a plurality of holes 136 configured to receive a fastener, such as a screw. In one embodiment, the base 128 is sized and shaped to completely overlie the first opening 124 in the mounting bracket 118.

The base 128 may have a substantially flat first surface 138 and a second surface 140 having a recess 142 configured to receive the heat pipe 130. The second surface 140 may have a thickness that equals a thickness of the heat pipe 130 so that the heat pipe 130 is planar with the second surface 140 when positioned in the recess 140. The first surface can be flat and smooth or otherwise treated or coated to provide for effective thermal contact with the mounting bracket 118.

The base 128 may have a second opening 144 from the first surface 138 that relates to a size and shape of the heat spreader 134. The opening 144 may form a recess in the first surface 138 that is configured to receive the heat spreader 134. When the heat spreader 134 is correctly positioned in the recess, the heat spreader 134 may be planar with the first surface 138 of the base 128. The heat spreader 134 may be a copper plate that moves heat from the GPU 106 to a secondary heat exchanger, such as the heat sink 120, which is larger in cross-section, surface area, and volume. In one embodiment, the heat spreader 134 directly overlies at least a portion of the GPU 106. In one embodiment, the heat spreader 134 is sized and shaped to be larger than the GPU 106 and smaller than the packaging 107 of the GPU 106. In an alternative embodiment, the heat spreader 134 completely fills the opening 124 of the mounting bracket 118.

The illustrated base 128 includes a first and a second side 146, 148, respectively, that are transverse to the first and second surfaces 138, 140 and are substantially parallel with each other. The first and second sides 146, 148 provide support for the fins 132, which can be formed as a separate element from the base 128. In this embodiment, the fins 132 are separately milled or formed so that the heat pipe 130 can be arranged between the base 128 and the fins 132. In an alternative embodiment, the fins 132 and the base 128 can be milled as a single heat sink without the heat pipe 130 or with the heat pipe 130 set into the first surface 138. The heat pipe 130 and the heat spreader 134 may be integrally formed. The base 128 may be formed to have the recess 142 in the first surface 138 so the integrally formed heat pipe and heat spreader can be planar with the first surface 138.

The fins 132 provide additional surface area to the heat sink 120 to enhance the transfer of thermal energy away from the GPU 106. The fins 132 maybe an array of fingers, such as a comb, or some other array of fin-like protrusions. In one embodiment, the fins are a single sheet of metal that is manipulated into an accordion-like shape. The fins increase the surface area of the heat sink 120 that is in contact with air and thus increases the dissipation of heat from the heat spreader 134 overlying the heat zone 114.

The heat sink 120 is formed from good thermally conductive material such as copper, aluminum, silver, or other metal that absorbs and dissipates heat from the GPU 106 using thermal contact. The contact can be direct or radiant. Copper is more expensive, and heavier, but is more than twice as efficient as aluminum as a thermal conductor. Different portions of the heat sink 120 may be formed from different thermally conductive materials. For example, the heat spreader 134 may be formed from copper because it is positioned overlying the GPU 106 while the base 128 may be formed from aluminum to reduce cost. Since aluminum is easier to work with the base may be formed by an aluminum extrusion process to easily form the complex cross-sections.

A thermally conductive grease may be used to ensure thermal contact between the heat spreader 134 and the GPU 106 and between other components that are transferring heat. Thermally conductive greases or thermal interface materials are known in the art and will not be described in detail herein.

The fasteners or other clamping mechanisms or adhesives may be used to bring the thermal management system 100 into thermal contact with the GPU 106.

The fan 122 includes a fan housing 150, a rotational base 152, and fan blades 154. The housing 150 is configured to attach to the mounting bracket 118 adjacent the heat sink 128. The plurality of holes 126 through the mounting bracket 118 may also be configured to cooperate with a plurality of holes 156 through the housing 150 of the fan 122. The fan housing 150 may be a thermally conductive material, such as metal, to enhance the heat dissipation by the thermal management system 100.

The fan 122 and the heat sink 120 work together to transfer the heat from the heat zone 114. The fan moves air over the fins 132 of the heat sink 120 and away from the heat zone 114. The heat sink 120 is a passive heat dissipater using the conductive heat transfer properties of the material. The fan 122 is an active heat dissipater moving air across the fins 132 of the heat sink 130 thereby achieving a larger temperature gradient through convection. The fan 122 moves the warmed air away from the GPU more quickly and efficiently than the heat sink 120 alone.

In one embodiment, a cover 158 is provided to protect the thermal management system 100 and the graphics processing card 102. The cover 158 includes a vent 160 that corresponds to the position of the fan in the thermal management system 100. The vent 160 allows air to travel through the system in order to dissipate heat from the heat zone 114 associated with the GPU 106.

In one embodiment, the fan 122 pulls cooler air across the fins 132 of the heat sink 120 and expels the warmed air through the vent 160. In an alternative embodiment, the fan 122 pulls cool air through the vent 160 and pushes the air across the fins 132 of the heat sink 120 and out an end 164 of the cover 158. Additional vents, such as slats, may be provided on the end 164 or other parts of the cover 158 to enhance air flow across the thermal management system 100.

For the maximum heat transfer from the GPU 106 to the heat sink 120, the heat spreader 134 can be positioned to directly overlie the GPU. The thermal interface material can separate the surface of the GPU from the heat spreader 134 to prevent damage while achieving the desired heat transfer. The heat spreader 134 is positioned adjacent the GPU 106 because the heat spreader has a high thermal conductivity that can transfer the high heat flow per unit area of the GPU 106 to the heat sink 120. The heat spreader may be a solid copper plate or other thermally conductive material. Alternatively, the heat spreader 134 may take the form of a planar heat pipe.

The heat pipe 130 includes a thermally conductive solid exterior with a thermally conductive fluid interior. The illustrated heat pipe 130 is an "S"-shaped sealed tube, such as copper or aluminum, having the thermally conductive fluid inside. Other sizes and shapes of the heat pipe 130 can be incorporated in the modular thermal management system 100. The recess 142 in the base 128 can be modified accordingly to accommodate a differently shaped heat pipe. For example, the heat pipe 130 may have a planar square shape that is sized to fill the space between the first and second sides 146, 148.

When the exterior of the heat pipe 130 is adjacent a heat source, such as the heat spreader 134, the pressurized fluid adjacent the hot exterior absorbs the latent heat and turns into vapor. The vapor then flows toward a cooler portion of the heat pipe where it condenses back into a liquid, experiencing another matter phase transition and releasing the latent heat.

The fluid may be water, ethanol, ammonia, acetone, sodium, helium, indium, or mercury, to name a few. The type of fluid selected depends on the temperature range of the application. In one embodiment, the fluid may move through the heat pipe through a wick structure that exerts capillary pressure on the liquid phase to move the condensed liquid back to the hot end of the heat pipe. The wick structure can be powder or channels formed in the heat pipe. In another embodiment, the heat pipe may use gravity to overcome surface tension to move the condensed liquid towards the hot portion of the heat pipe.

As mentioned above, the heat spreader 134 may be a rectangular heat pipe that utilizes matter phase transition to transfer the heat away from the GPU 106. Planar heat pipes are also sealed vessels with a plurality of channels, chambers, or capillary structures that circulate the fluid in the different phases.

Figure 2:
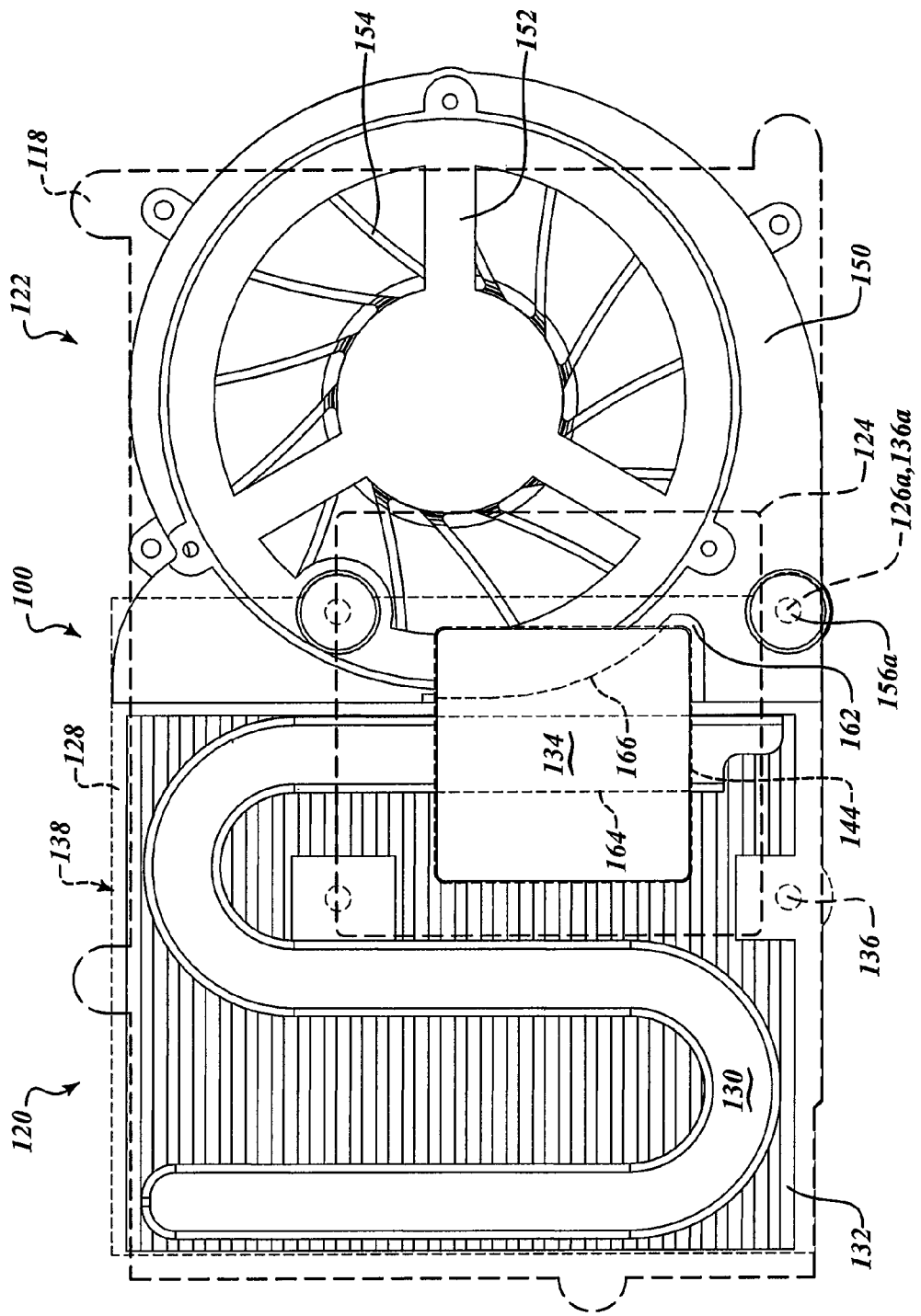
FIG. 2 is a plan view of a heat sink and fan arrangement of the thermal management system of FIG. 1.

FIG. 2 is a plan view of the thermal management system 100 viewed from the first surface 138 of the base 128 and the fan 122 after assembly and that includes the outline of the mounting bracket 118 and the first opening 124. The first opening 124 through the mounting bracket 118 aligns with the heat spreader 134 that is positioned within the second opening 144 of the base 128 of the heat sink 120. In one embodiment, the fan 122 overlaps the heat sink 120, which can be seen through the opening 124. The housing 150 and the rotational base 152 of the fan 122 may also be formed of thermally conductive material to enhance the heat dissipation from the GPU 106.

The second opening 144 through the base 128 of the heat sink 120 is configured to allow the heat pipe 130 to directly contact the heat spreader 134. A solid portion 162 of the base 128 of the heat sink 120 and the housing 150 of the fan 122 are visible around the heat spreader 134 through the first opening 124 of the mounting bracket 118. The portion 162 fills the space between a straight first edge 164 of the heat pipe 130 and a curved second edge 166 of the housing 150. The shape of the portion 162 depends on the configuration of the heat pipe 130 and the housing 150.

A ratio of dimensions of the heat spreader 134 to dimensions of the first opening 124 is not fixed and can be varied. In this embodiment, the heat spreader 134 is smaller in size than the first opening 124. The heat spreader 134 and the second opening 144 in the base 128 may be formed to have dimensions that are equal to or slightly smaller than the dimensions of the first opening 124 in the mounting bracket 118.

The base 128 of the heat sink 120 and the housing 150 of the fan 122 overlap in one embodiment so that a fastener attaches the housing 150 to the base 128 and to the mounting bracket 118. For example, the holes 126a, 136a, and 156a are through the mounting bracket 118, the base 128, and the housing 150, respectively, and are configured to align to assemble the thermal management system 100. The overlap of the base 128 and the fan housing 150 can help reduce the size of the thermal management system 100. The fan 122 overlaps the heat sink 120 because the fan is more likely to fail first, so the fan 122 can be easily replaced without impacting the rest of the thermal management system.

The second opening 144 through the base 128 may be partially covered by the solid portion 162 formed of conductive material that is configured to fill the gap between the first edge 164 of the recess 142 and the second edge 166 of the fan housing 150. The solid portion 162 is sized and shaped to have conductive material adjacent the heat spreader 134 so that the entire surface of the heat spreader 134 is in thermal contact with conductive portions of the heat sink 120.

The heat spreader 134 is in direct thermal communication with the heat pipe 130. The heat generated by the GPU 106 and the memory during operation of the graphics processing card 102 is transferred from the heat spreader 134 to the heat pipe 130. The fluid in the heat pipe 130 positioned adjacent the heat spreader 134 will change phase and move towards the cooler end of the heat pipe 130. As the heated vapor phase moves through the heat pipe 130, the latent heat is absorbed by the fins 132 of the heat sink 120. The large surface area of the fins provides additional heat transfer away from the heat zone 114. In one embodiment, the heat spreader 134 is integrally formed with the heat sink 120 and the heat pipe 130.

FIGS. 3A-3D illustrate a variety of positions of the GPU 106 with respect to a fixed position of the mounting bracket 118 on the printed circuit board 104. With the fixed position of the mounting bracket 118, the GPU 106 can be positioned in the variety of locations on the printed circuit board 104 while remaining in thermal contact with the thermal management system 100.

Figure 3A:
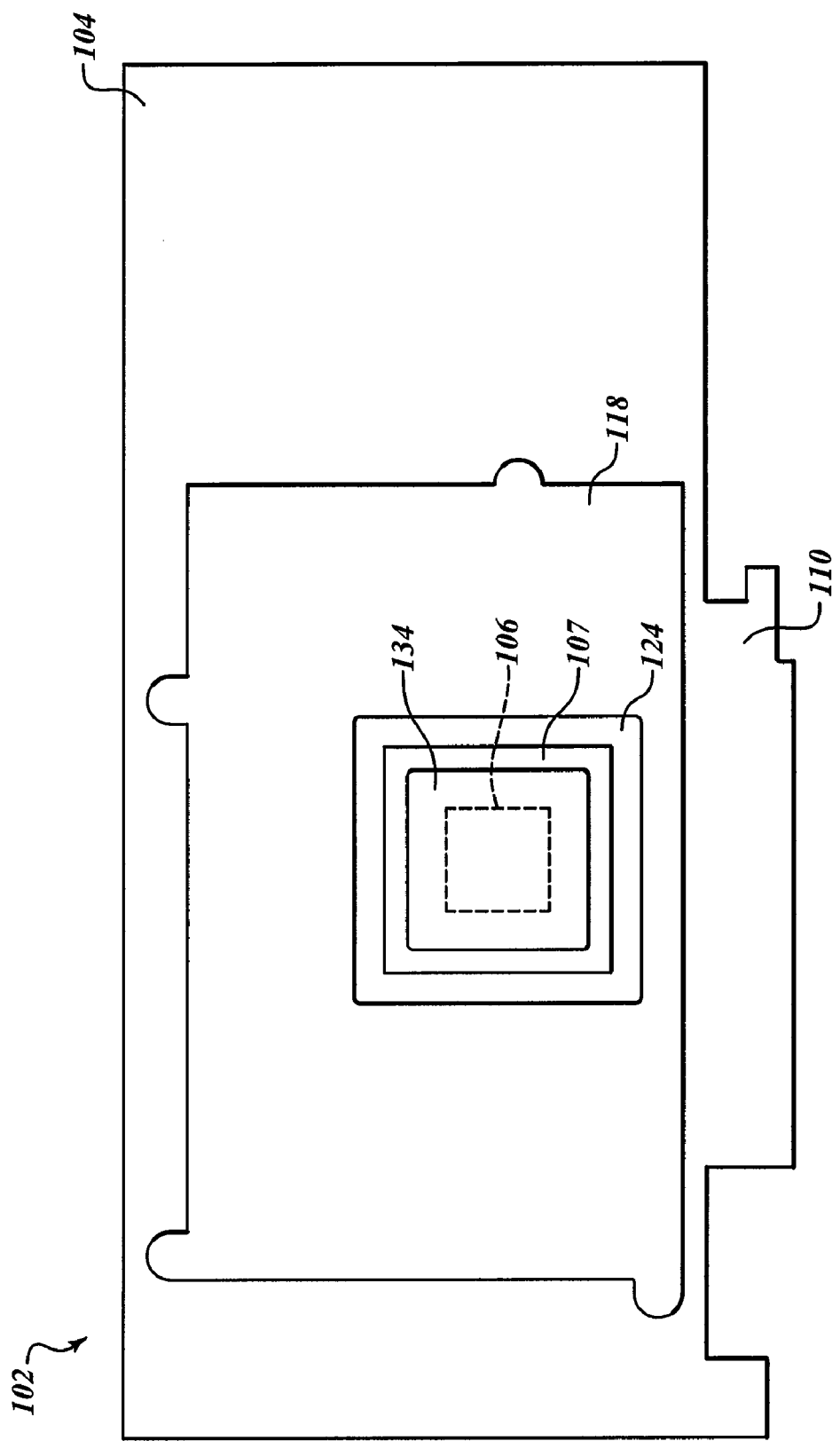
FIGS. 3A-3D are top plan views of a position of a GPU on a graphics processing card in relation to a fixed bracket position according to an embodiment of the present disclosure.

FIG. 3A is a simplified top down view of the printed circuit board 104 with components of the modular thermal management system 100 positioned overlying the GPU 106 that is centrally positioned within the first opening 124 of the mounting bracket 118. In this embodiment, the heat spreader 134 is larger than the GPU 106 and smaller than the packaging 107. However, as described above, the heat spreader may be closer in size to the first opening 124 in the mounting bracket 118.

Figure 3B:
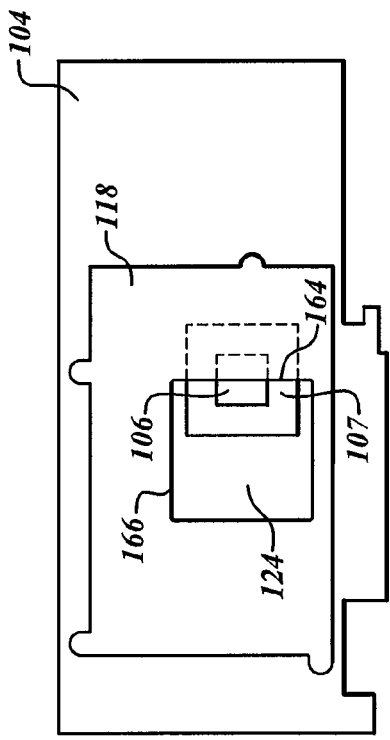
Figure 3D:
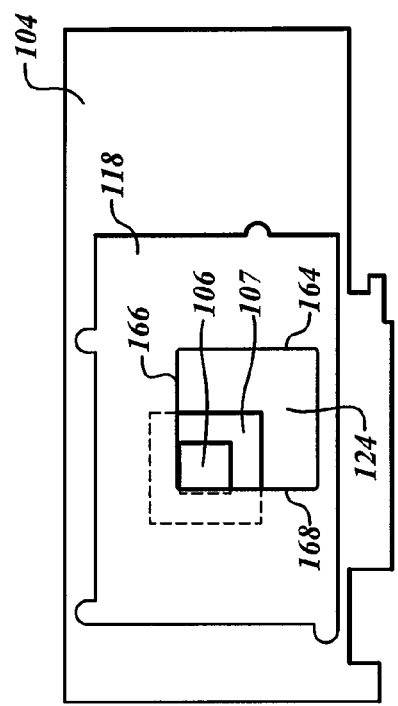
Figure 3C:
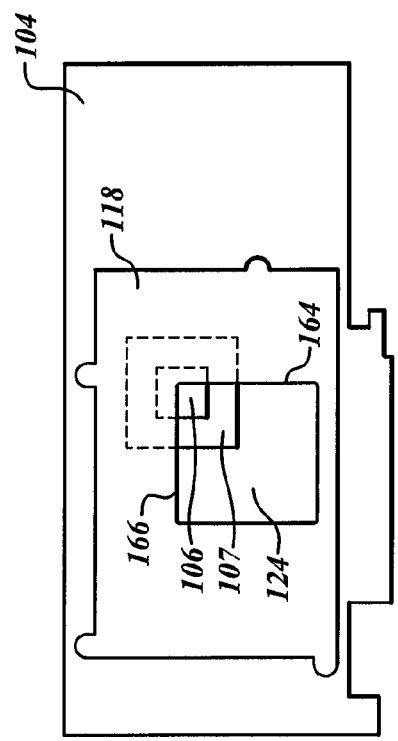

FIGS. 3B-3D show alternative positions of the GPU 106 with respect to the fixed position of the mounting bracket 118. For example, in FIG. 3B the GPU 106 is partially covered by a first edge 164 of the first opening 124. In FIG. 3C, the GPU 106 is positioned in a corner between the first edge 164 and a second edge 166 of the first opening 124. In FIG. 3D, the GPU is positioned in another corner between the second edge 166 and a third edge 168 of the first opening 124.

As can be seen by these Figures, the position of the GPU can be varied greatly with regard to the fixed position of the mounting bracket 118 on the printed circuit board 104. If the manufacturer elects to position the GPU 106 to be partially covered by one of the edges of the first opening 124, the size of the heat spreader 134 can be adjusted to more closely match the size of the first opening 124. In this embodiment, using a heat pipe as the heat spreader 134 may better transfer heat away from the GPU 106 across the opening and into the heat sink 120. If a larger heat spreader 134 is utilized, the second opening 144 in the base 128 of the heat sink 120 will be modified accordingly.

FIGS. 4A-4C illustrate various positions of the mounting bracket 118 with respect to a variety of positions of the GPU 106. FIG. 4A illustrates the GPU 106 positioned within the first opening 124 of the mounting bracket 118 slightly shifted from the center of the opening. In this embodiment, a smaller heat spreader may be utilized because the GPU 106 is not positioned directly adjacent or under an edge of the first opening 124.

In FIG. 4B, the mounting bracket 118 is positioned adjacent a first end 170 of the printed circuit board 104. The location of the GPU 106 is positioned adjacent a first side 172 of the printed circuit board 104 associated with the first interface 110. The GPU 106 is at a position on the printed circuit board 104 that is closest to the first end 170 and the first side 172, bound by the size of the mounting bracket 118.

In FIG. 4C, the mounting bracket 118 is positioned adjacent a second end 174 of the printed circuit board 104 that is associated with the second interface 112. The GPU 106 is positioned at an opposite side of the printed circuit board 104 as opposed to the position illustrated in FIG. 4B. As with FIG. 4B, the position of the GPU 106 is bound by the size of the mounting bracket 118. In order to transfer heat away from the GPU 106, at least a portion of the GPU should be within the opening 124.

The modular thermal management system 100 provides the manufacturer with a variety of position options for the GPU 106, while maintaining a smaller number of parts related to cooling of the graphics processing cards 102. FIGS. 3A-3D and 4A-4C illustrate the wide range of possible positions the manufacturer can choose from without having to design a new cooling system for each variation in arrangement of the printed circuit board 104. The thermal management system 100 can be rearranged, replaced, and interchanged easily between a variety of printed circuit board arrangements having the GPU 106 in different positions.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety.

Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A modular thermal management system that allows a single heat sink and fan combination to transfer heat away from a heat zone of a variety of graphics processing cards, the thermal management system comprising:

a mounting bracket configured to attach to a respective graphics processing card of the variety of graphics processing cards in thermal contact with the heat zone, the mounting bracket having a first opening that can correspond to a processor in a plurality of positions in the heat zone;

the single heat sink and fan combination comprises:
a heat sink configured to attach to the mounting bracket, the heat sink comprises:
a base having a first surface, a second surface opposing the first surface, and a second opening through the first surface of the base, the first surface positioned adjacent the mounting bracket and the second surface having a recess configured to receive a heat pipe;
a plurality of fins thermally coupled to the base, and
a heat spreader positioned within the second opening of the base and positioned to overlie at least a portion of the processor in the first opening of the mounting bracket,
wherein the heat sink overlies the first opening and is in thermal contact with at least a portion of the processor through the first opening regardless of the exact location of the processor; and
a fan configured to attach to the mounting bracket adjacent the heat sink.

2. The thermal management system of claim 1 wherein the mounting bracket and the heat sink are made from a thermal conductive material to transfer heat away from the processor and the heat zone on the graphics processing card.

3. The thermal management system of claim 1 wherein the heat pipe is positioned between the second surface of the base and the plurality of fins.

4. The thermal management system of claim 1 wherein the heat pipe is positioned in the recess in the base and is coplanar with the second surface of the base and the plurality of fins abut the second surface of the base.

5. The thermal management system of claim 1 wherein the heat spreader thermally couples to the heat pipe in the recess of the base through the second opening.

6. The thermal management system of claim 5 wherein the heat spreader is configured to be coplanar with the first surface of the base.

7. the thermal management system of claim 1 wherein the first opening in the mounting bracket is larger than the processor.

8. The thermal management system of claim 1 wherein the second opening of the base is smaller than the first opening of the mounting bracket.

9. The thermal management system of claim 1 wherein the base has a plurality of extensions transverse to the second surface and configured to retain the plurality of fins in thermal contact with the base.

10. A modular thermal management system, comprising:
a mounting plate configured to attach to a printed circuit board, wherein a size of the mounting plate corresponds to a heat zone of the printed circuit board;
a first opening in the mounting plate having dimensions that correspond to a size of the processor;
a heat sink configured to attach to the mounting plate aligned with the first opening, the heat sink comprising:
a base having a second opening that corresponds to the processor;
a heat pipe coupled to the base configured to distribute heat throughout the heat sink; and
a plurality of fins coupled to the base configured to dissipate heat; and
a fan base coupled to the mounting plate adjacent the heat sink; and a plurality of fan blades coupled to the fan base.

11. The modular thermal management system of claim 10, further comprising a heat spreader configured to thermally couple to the base of the heat sink through the second opening.

* * * * *